United States Patent [19]
Bachmann

[11] Patent Number: 4,644,130
[45] Date of Patent: Feb. 17, 1987

[54] METHOD FOR CREATING BLIND HOLES IN A LAMINATED STRUCTURE

[75] Inventor: Friedrich Bachmann, Munich, Fed. Rep. of Germany

[73] Assignee: Siemens Aktiengesellschaft, Berlin and Munich, Fed. Rep. of Germany

[21] Appl. No.: 735,276

[22] Filed: May 17, 1985

[30] Foreign Application Priority Data

May 18, 1984 [DE] Fed. Rep. of Germany ........ 3418593

[51] Int. Cl.$^4$ .............................................. B23K 26/00
[52] U.S. Cl. ........................ 219/121 LJ; 219/121 LW
[58] Field of Search .... 219/121 LW, 121 L, 121 LM, 219/121 LH, 121 LJ

[56] References Cited

U.S. PATENT DOCUMENTS 4,030,190  6/1977  Varker .................................. 29/625
4,328,410  5/1982  Slivinsky et al. ......... 219/121 LH X
4,370,175  1/1983  Levatter ..................... 219/121 L X

FOREIGN PATENT DOCUMENTS 2702844  1/1984  Fed. Rep. of Germany .

OTHER PUBLICATIONS

R. Srinvisan et al, "FAR–UV Photoetching of Organic Material", *Laser Focus*, May 1983, pp. 62–66.

Primary Examiner—C. L. Albritton
Attorney, Agent, or Firm—Hill, Van Santen, Steadman & Simpson

[57]            ABSTRACT

A method for producing blind holes in a multilayered structure having a metal-synthetic-metal laminated structure characterized by forming an aperture in a metal layer of the laminated structure at the location for each of the blind holes and directing laser radiation of an excimer laser through the aperture to remove the underlying synthetic material with the removal operation being terminated by the oppositely positioned metal layer which is resistant to the laser beam.

9 Claims, 2 Drawing Figures

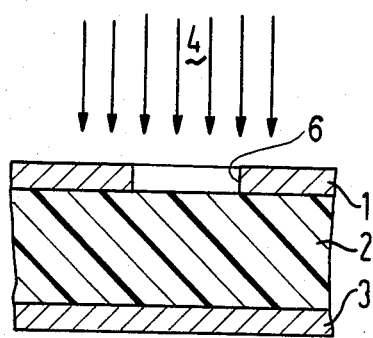
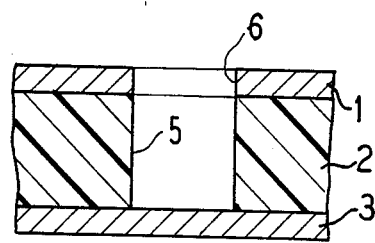

METHOD FOR CREATING BLIND HOLES IN A LAMINATED STRUCTURE

BACKGROUND OF THE INVENTION

The present invention is directed to a method for creating throughplating holes in a multilayer structure, or example, a multi-ply printed circuit board which has a layer sequence of metal-synthetic-metal layers.

In multi-ply printed circuit boards, the individual wiring levels are directly conductively connected to one another by means of so-called throughplatings. Miniaturization of the printed circuit boards is limited by, among other things, a space requirement for these throughplatings. The space requirement is determined by the area that must be reserved in the wiring level or layer for the throughplating as well as by the length of the throughplating. In length, the throughplating extends either through the entire thickness of the printed circuit board or through the entire thickness of a prefabricated single core within the printed circuit board.

It is known to mechanically drill the holes for the throughplatings. In this method, the space requirement of the throughplating is essentially co-defined by the drill diameter. It is not possible in mechanical boring to reliably produce blind holes which terminate on a metal layer lying in the printed circuit board. The minimum drilling diameter is limited by the drilling tool. Other methods of producing throughplating openings are therefore gaining in significance with increased miniaturization of the circuit boards.

It has also been known to utilize a focused $CO_2$ laser for producing blind holes in a single-shot method, which blind holes are subsequently plated or filled with metal to form the connection between two metal layers. Such a method is briefly discussed in U.S. Pat. No. 4,030,190. In this method for producing a multilayered printed circuit, the bottom metal layer will serve for terminating or concluding the process of removing the layer of synthetic or plastic insulating layer.

SUMMARY OF THE INVENTION

The object of the present invention is to provide a method for forming at least one blind hole in a laminated structure having a pair of metal layers separated by a synthetic layer with the blind hole being through one of the pair of metal layers and the synthetic layer and terminating at the other metal layer. The method is suitable for producing these blind holes and further does justice to the increasing miniaturization occurring in printed circuit board designs. In addition, the method of the invention can also be utilized even when an unfavorable aspect ratio, for example, small diameters in comparison to the depth of the hole, is present.

To accomplish these goals, the method comprises providing an excimer laser and a laminated structure with a synthetic layer separating a pair of metal layers which are resistant to the laser radiation or beam of the excimer laser and with one of the pair of metal layers being provided with an aperture at the location of each blind hole with the remaining portion of the one layer being a mask for the laser radiation, then forming the blind hole by directing the laser radiation of the excimer laser at each aperture to remove the material of the synthetic layer exposed by each aperture to form a blind hole with the other layer of the pair of metal layers terminating the forming step.

Other objects and advantages of the present invention will be apparent from the following description, claims and drawings.

BRIEF DESCRIPTION OF THE DRAWINGS

FIG. 1 is a cross-sectional view illustrating a step of forming a blind hole in accordance with the present invention; and FIG. 2 is a cross-sectional view of the blind hole formed by the method of the present invention.

DESCRIPTION OF THE PREFERRED EMBODIMENTS

The principles of the present invention are particularly useful for forming a blind hole 5 in a laminated structure having a synthetic layer 2 separating and insulating a first metal layer 1 from a second metal layer 3.

The method of the present invention is based on a photochemical process which is referred to as "ablative photodecomposition" as disclosed in an article by R. Srinivasan et al, "FAR-UV PHOTOETCHING OF ORGANIC MATERIAL", Laser Focus, May 1983, pp. 62–66. At wavelengths below 200 nm, the photon energy of the radiation from the laser suffices in order to break up bonds in organic molecules via electronic excitation. While the bonds can be restored after the end of the laser pulse which is below a critical intensity threshold, a very slow erosion will occur. However, above this threshold intensity for the laser radiation, the molecule fragments receive so much excess energy in rotational, vibrational and translational degrees of freedom that the fragments will depart the material. In this case, material erosion is to be expected over the absorption depth. Since a considerable part of the excess energy is entrained in the molecule fragments, no significant heating of the material will take place.

In the inventive method for producing blind holes 5 in a synthetic layer 2 of a laminated structure, a starting laminated structure which has, for example, a copper layer 1, synthetic or plastic insulating layer 2 and copper layer 3 is provided as the starting material. At the locations which are to have the blind holes for throughplating, the upper copper layer 1 is eroded in accordance with traditional photoetching technology to form aperture 6 for each location. The remaining copper of layer 1 around the aperture 6 will serve as a mask to the laser radiation 4. At each of the etched locations, which have the aperture 6, a laser radiation 4 from an excimer laser is directed and the exposed material of the synthetic layer 2 is eroded per laser pulse. A plurality of laser pulses are thus needed to reliably produce a penetrating bore. In contrast to known single-shot methods of utilizing focused lasers, in the technical execution according to the present invention, the entire circuit board is scanned or swept with the laser beam which may have an area of about 0.5 cm × 1 cm. The synthetic material is removed only where the apertures in the metal layer are present. This scanning can be accomplished by relative movement between the beam of radiation 4 and structure to provide an offset from track-to-track. Given a suitable selection of the feed rate of a substrate which is formed by the laminated structure and of the repetition rate of the laser, every point of the substrate will receive a specific plurality of laser pulses so that the potential inhomogeneities of the laser beam are averaged out. Exact positioning of the substrate resp. the laser beam is not necessary. In practice, a KrF excimer laser has a wavelength of approximately 248 nm and is focussed to an energy density of about 750 mJ/cm$^2$. With such a laser, material erosion will stop at the bottom copper layer 3 so that the blind holes 5 will have a high reliability.

The arrangement of the invention is not limited to cylindrical blind holes. On the contrary, any desired structure can be produced with the present invention. By varying the angle of incidence of the laser radiation 4 to a normal of the surface of layer 1, it is even possible to produce a slanted hole wall by a blind hole which has an axis at an angle to the surface normal for the metal layers 1 and 3.

It should be noted that after forming the blind hole 5 it will be filled with a conductive material by either electroplating or vapor-depositing a metal into the hole to form the connection between layers 1 and 3. It is also noted that if the plurality of different holes are provided and if the radiation 5 is conducted over the entire surface of the laminated structure, the plurality of blind holes having various cross-sectional configurations can be formed.

Although various minor modifications may be suggested by those versed in the art, it should be understood that I wish to embody within the scope of the patent granted hereon, all such modifications as reasonably and properly come within the scope of my contribution to the art.

I claim:

1. A method of forming at least one blind hole in a laminated structure having a pair of metal layers separated by a synthetic layer with the blind hole being through one metal layer, the synthetic layer and terminating at the other metal layer of the pair, said blind hole providing space to form an electrical connection between the pair of metal layers, said method comprising the steps of providing an excimer laser and a laminated structure with a synthetic layer separating a pair of metal layers which are resistant to the laser radiation of the excimer laser with the synthetic layer being bonded to each of the pair of metal layers, one of the pair of metal layers being provided with an aperture at a location of each blind hole to be formed and the remaining portion of the one layer being a radiation mask; and then forming the blind hole by directing the laser radiation from the excimer laser at each aperture to remove the material of the synthetic layer exposed by each aperture and to form a blind hole with the other layer of the pair terminating the forming step.

2. A method according to claim 1, wherein the step of directing the laser radiation comprises moving the laminated structure relative to the laser beam to obtain a uniform illumination of the entire area of the laminated structure.

3. A method according to claim 1, wherein the step of directing the laser radiation directs the laser radiation inclined relative to a surface normal of the one metal layer to form a blind hole having an axis extending at an angle inclined to the surface normal.

4. A method according to claim 3, wherein the step of directing the laser radiation includes moving the laminated structure relative to the laser radiation to obtain a uniform illumination of the entire area of the laminated structure.

5. A method according to claim 1, wherein the pair of metal layers of the laminated structure are copper layers, and wherein the excimer laser is operated with the laser radiation having a wavelength of 248 nm and an energy density of 750 mJ/cm$^2$.

6. A method according to claim 5, wherein the step of directing the laser radiation includes moving the laminated structure and the laser radiation relative to each other to uniformly illuminate the entire area of the laminated structure.

7. A method according to claim 5, wherein the step of directing the laser radiation directs radiation inclined relative to a surface normal of the one metal layer for producing a blind hole having an axis inclined to the surface normal.

8. A method according to claim 7, wherein the step of forming the blind holes includes relatively moving the laminated structure to the path of the laser radiation to obtain a uniform illumination of the entire surface of the laminated structure.

9. A method according to claim 1, which subsequent to the step of forming the blind holes includes forming an electrical connection through each blind hole between the pair of metal layers.

* * * * *